United States Patent
Jiang et al.

(10) Patent No.: US 9,325,421 B1
(45) Date of Patent: Apr. 26, 2016

(54) BURST-MODE LASER CONTROL CIRCUIT AND THE METHOD THEREOF

(71) Applicants: Xu Jiang, Chengdu (CN); Yuan Song, Chengdu (JP); Shuyuan Zhang, Chengdu (CN); Yuanzhong Xu, Chengdu (CN)

(72) Inventors: Xu Jiang, Chengdu (CN); Yuan Song, Chengdu (JP); Shuyuan Zhang, Chengdu (CN); Yuanzhong Xu, Chengdu (CN)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 0 days.

(21) Appl. No.: 14/522,409

(22) PCT Filed: Jun. 30, 2014

(86) PCT No.: PCT/CN2014/081129
§ 371 (c)(1),
(2) Date: Jan. 7, 2016

(87) PCT Pub. No.: WO2016/000119
PCT Pub. Date: Jan. 7, 2016

(51) Int. Cl.
*H04B 10/00* (2013.01)
*H04B 10/50* (2013.01)
*H04B 10/564* (2013.01)
*H04J 14/00* (2006.01)

(52) U.S. Cl.
CPC ............ *H04B 10/503* (2013.01); *H04B 10/564* (2013.01)

(58) Field of Classification Search
CPC ................................ H01S 5/042; H01S 5/0427
See application file for complete search history.

(56) References Cited

U.S. PATENT DOCUMENTS 7,174,099 B1   2/2007   Chinn et al.
7,853,154 B2   12/2010  Ikram et al.
(Continued)

FOREIGN PATENT DOCUMENTS

CN    101436902 A    5/2009
CN    102098106 A    6/2011
CN    202160180 U    3/2012
(Continued)

OTHER PUBLICATIONS

Kan Wang et al.; "Discretely Designed 10G Burst Transmitter"; Bibliographic Data of CN102546028 (A); Jul. 4, 2012; http://worldwide.espacenet.com.
(Continued)

*Primary Examiner* — Daniel Dobson
(74) *Attorney, Agent, or Firm* — Andrew D. Fortney; Central California IP Group, P.C.

(57) ABSTRACT

A burst-mode laser control circuit and related methods thereof are disclosed. Using an APC loop with an additional burst-mode control circuit, and a switch in series with a diode and in parallel with the laser, a continuous-mode laser driver is enabled to operate in burst-mode by turning the switch on or off via external logic. Burst-mode control manages the switch, and a bandwidth-select circuit using a high or low logic level input, wherein the laser is disabled and the bandwidth-select circuit enters a fast-track mode when the external logic signal has a first level. The laser provides regular optical signals, and the bandwidth-select circuit enters a slow-track mode, thereby enabling the APC loop to operate normally, when the external logic signal has a second level. In addition to a low cost and simple implementation, the control circuit and method provide lasers with a fast response capability using one or more externally-controlled switch circuits to meet demands of PON systems for burst-mode ONUs.

17 Claims, 5 Drawing Sheets

(56) References Cited

U.S. PATENT DOCUMENTS

2005/0271099 A1* 12/2005 Miremadi ............ H04B 10/504
372/38.02
2007/0286609 A1    12/2007 Ikram et al.

FOREIGN PATENT DOCUMENTS

| CN | 202177841 U | 3/2012 |
|---|---|---|
| CN | 102546028 A | 7/2012 |

OTHER PUBLICATIONS

Bing Li et al.; "Numerical Control Type Automatic Program Control (APC) Module for Burst Mode Laser Driver"; Bibliographic Data of CN202177841 (U); Mar. 28, 2012; http://worldwide.espacenet.com.

Xinyuan Zheng et al.; "Up Channel Burst Mode Optical Transmission Circuit for Radio Frequency Over Glass"; Bibliographic Data of CN202160180 (U); Mar. 7, 2012; http://worldwide.espacenet.com.

Kan Wang et al.; "Optical Line Terminal for Wavelength Division Multiplexing-Time Division Multiplexing Passive Optical Network"; Bibliographic Data of CN102098106 (A); Jun. 15, 2011; http://worldwide.espacenet.com.

Hua Zhang et al.; "Optical Network Unit"; Bibliographic Data of CN101436902 (A); May 20, 2009; http://worldwide.espacenet.com.

PCT International Search Report and Written Opinion; PCT International Searching Authority/CN dated Mar. 27, 2015; International Application No. PCT/CN2014/081129; 12 pages; International Searching Authority/State Intellectual Property Office of the P.R. China; Beijing, China.

* cited by examiner

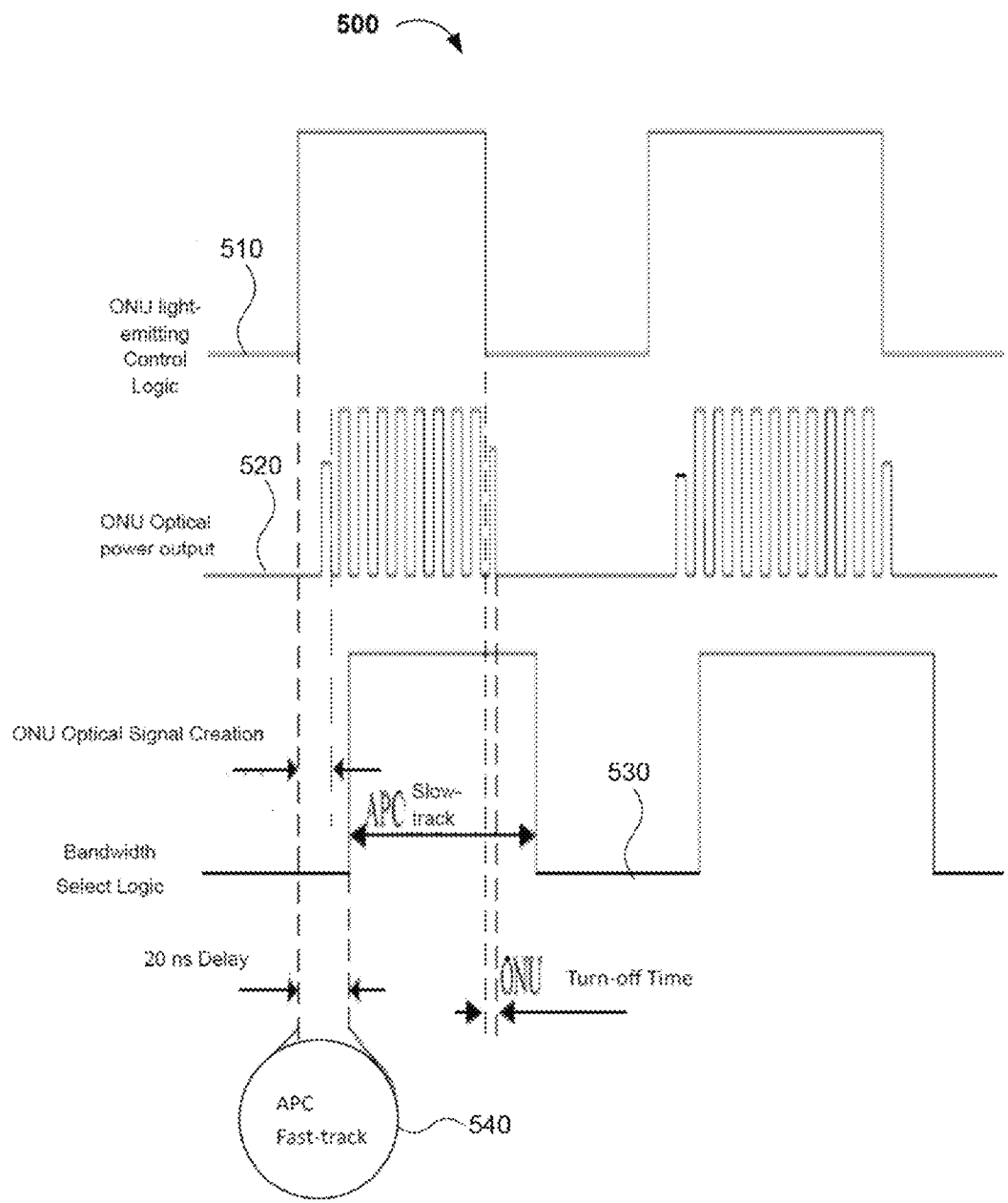

BURST-MODE LASER CONTROL CIRCUIT AND THE METHOD THEREOF

FIELD OF THE INVENTION

This invention relates to the field of laser devices, especially to burst-mode laser control circuits and methods pertaining thereto.

DISCUSSION OF THE BACKGROUND

In conventional burst-mode laser driver circuits, laser devices generally do not operate in burst-mode without burst-mode laser drivers. However, with regard to 10G or higher speed laser devices, such as DFB (Distributed Feedback) laser devices Laser) or EML (Electro-absorption Modulated Laser) devices, there are only continuous-mode laser drivers. With the development of 10G PON (Passive Optical Network) applications, ONU (Optical Network Unit) products supporting 10G or higher speeds are needed to meet the demands of PON systems for burst-mode operation.

SUMMARY OF THE INVENTION

This invention provides a burst-mode laser control circuit and a method of improved burst-mode control for laser devices. The technical solution(s) are as follows: a burst-mode laser control circuit with an APC loop, having an additional burst-mode control circuit; the burst-mode control circuit comprising a switch in series with a diode and in parallel with the laser, enabled or disabled by external logic, to thereby provide burst-mode control for laser devices (e.g., continuous mode lasers).

The switch and the bandwidth-select circuit may be controlled by a high or low logic level input from the external logic.

The bandwidth-select circuit may comprise or consist of two functional circuits: a high-low bandwidth-select circuit and a delay circuit.

The high-low bandwidth-select circuit has at least two modes: a fast-track mode and a slow-track mode.

When the external logic controls the switch and bandwidth-select circuit via a high or low logic level input, the laser is disabled and the bandwidth-select circuit enters the fast-track mode when a high logic level is inputted (e.g., applied to the switch); and the laser provides regular optical signals (e.g., is enabled) and the bandwidth-select circuit enters the slow-track mode when a low logic level is inputted (e.g., applied to the switch).

The delay circuit comprises delay control logic configured to operate the APC loop in the fast-track mode before enabling the laser and operate the APC loop in the slow-track mode when enabling the laser to operate (e.g., normally, in various code patterns). The delay control logic enables the APC loop to control power to the laser before the laser is enabled, thereby providing a stable laser power output when the laser begins to operate.

A method of controlling a burst-mode laser may comprise disconnecting a switch and placing a bandwidth-select circuit in a fast-track mode when a logic input to an optical network unit (ONU) in a passive optical network (PON) has a first state, the ONU including the switch, a laser, a laser driver, a diode and the bandwidth-select circuit; after the predetermined period of time, driving the laser using the laser driver and transmitting an optical signal from the laser normally; when the optical signal from the laser is stable, placing the bandwidth-select circuit in a slow-track mode; when the logic input to the ONU has a second state, turning on the switch to disable the optical signal from the laser and connect the laser in parallel with the diode; and placing the bandwidth-select circuit in the fast-track mode when the logic signal has the first logic state again. In one embodiment, the first logic state of the logic signal is a high logic level, and the second logic state of the logic signal is a low logic level. When the switch is turned on, decreasing a voltage/current at ends (e.g., the cathode and the anode) of the laser results in no optical output from the laser.

Relative to the prior art, the present invention advantageously provides:
1. In this invention, a burst-mode laser driver is replaced by a continuous mode laser driver having a fast response under the control of a switch and a mode control circuit. This invention can be used to meet demands of PON systems for the burst-mode of ONUs, especially for high speed signals, such as 10G PON applications; and
2. Low cost and easy implementation, and adaptability for both DFB laser devices and EMLs, and ensuring both fast establishment of a stable APC loop and stable APC loop operation in normal conditions by providing bandwidth switching using one or more switches and one or more filter circuits.

BRIEF DESCRIPTION OF THE DRAWINGS

FIG. 5 is a diagram showing waveforms for sequential logic to a control the exemplary bandwidth-select circuit, APC loop, and laser according to the present invention.

DETAILED DESCRIPTION

Figure 1:
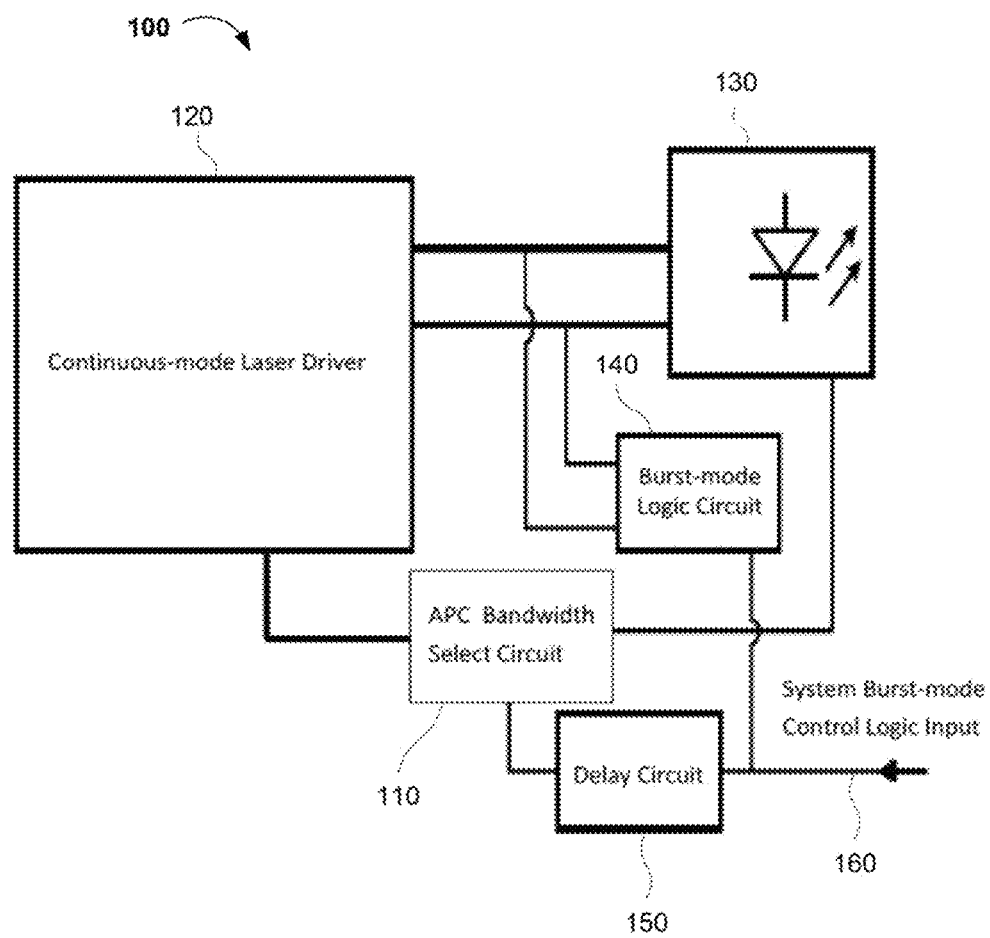
FIG. 1 is a block diagram showing an exemplary circuit design according to the present invention.

Referring to FIG. 1, the present invention provides a burst-mode laser control circuit. In this invention, an APC loop including, for example, APC bandwidth select circuit 110, continuous mode laser driver 120, and laser 130, has an additional burst-mode control circuit 140, and a switch (FIG. 2) in series with a diode and in parallel with the laser, which enables the continuous-mode laser driver 120 to operate in burst-mode by turning the switch on or off via an external logic signal 160. Burst-mode control manages the switch and the bandwidth-select circuit 110 using high or low logic level inputs, wherein the laser 130 is disabled and the bandwidth-select circuit 110 enters a fast-track mode when the external logic signal 160 has a first state, such as a high logic level; the laser 130 is enabled and provides regular optical signals such as burst-mode optical signals, and the bandwidth-select circuit 110 enters a slow-track mode, when the external logic signal 160 has a second state, such as a low logic level. In the slow-track mode, the arrangement enables the APC loop to operate normally, such as in burst mode operation.

A First Embodiment

Figure 2:
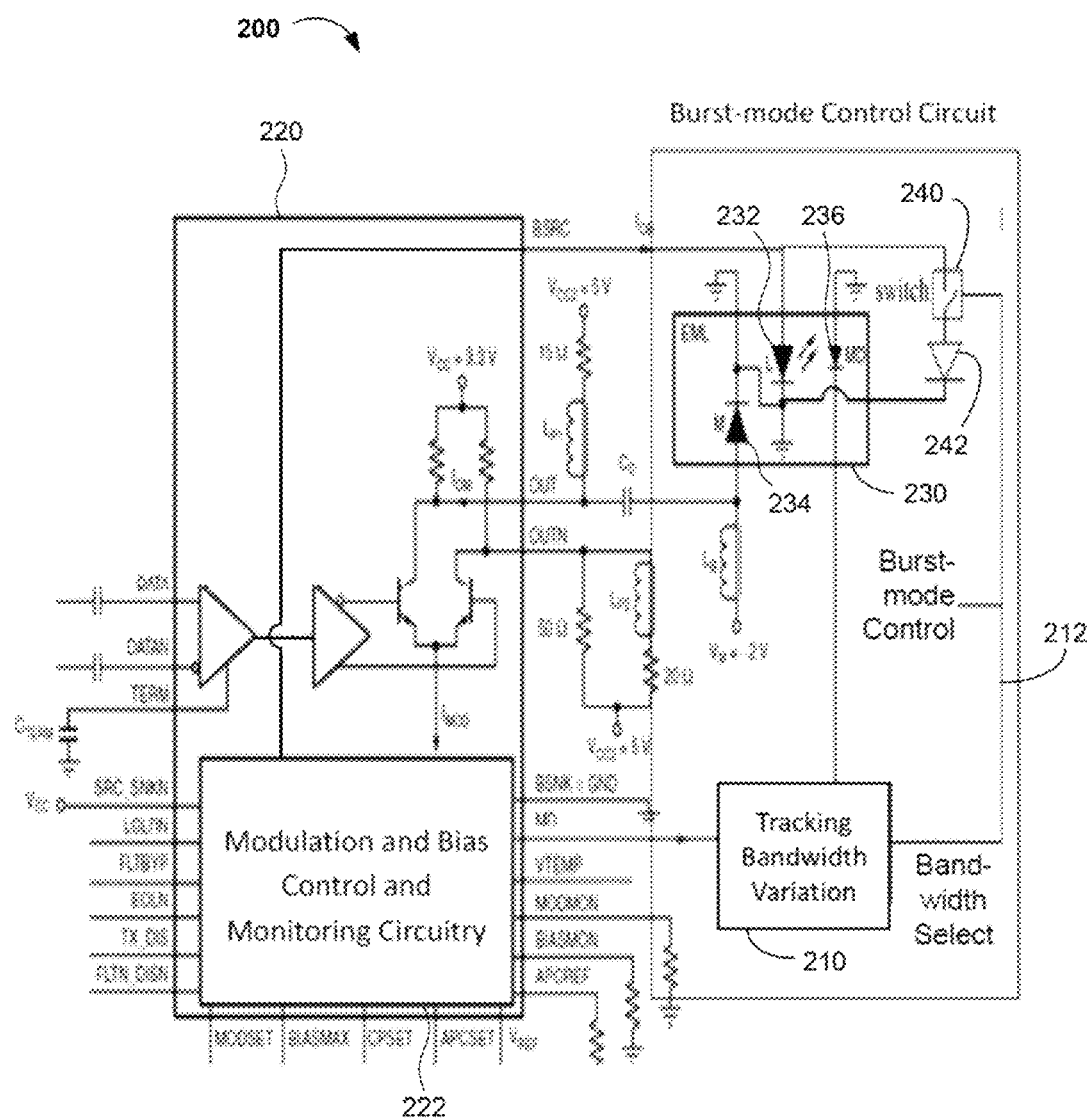
FIG. 2 is a diagram showing an exemplary EML burst-mode control circuit according to the present invention.

Referring to FIG. 2, an EML laser device 230 including a laser 232, a modulator 234 and a monitor photodiode 236, is controlled at least in part by a burst-mode control circuit including a switch 240, a diode 242, and a bandwidth tracking and/or variation control circuit 210. The burst-mode laser control circuit portion of FIG. 2 provides laser devices with burst-mode control by turning the switch 240 on or off under the control of an external logic signal 260, while the switch 240 is in serial connection with the diode 242 and in parallel connection with the EML laser device 232. The diode 242 creates a high impedance at the cathode of the laser 232.

In addition, the burst-mode control manages the switch 240 and the bandwidth-select circuit 210 in the ONU 200 via a high or low logic level input 260 from the PON system, wherein, for example, a TTL (Transistor-Transistor Logic) high logic level may be between 2.4V and 3.3V, and the low logic level may be between 0V and 0.8V. The input control logic for the signal 260 is a system input. The system provides a high or low level input according to whether the ONU 200 is to be enabled for transmissions.

The EML 230 is disabled and the bandwidth-select circuit 210 enters the fast-track mode when the burst mode control signal 260 has a first state, such as a high logic level. The EML 230 is enabled and provides regular optical signals such as burst-mode optical signals, and the bandwidth-select circuit 210 enters the slow-track mode, when external logic signal 160 has a second state, such as a low logic level. In the slow-track mode, the APC loop, including the bandwidth-select circuit 210, the continuous mode driver circuitry 220, and the EML 230, ensures a stable optical power to the EML 230 using the modulation and bias control and monitoring circuitry 222 in the APC loop.

A Second Embodiment

Figure 3:
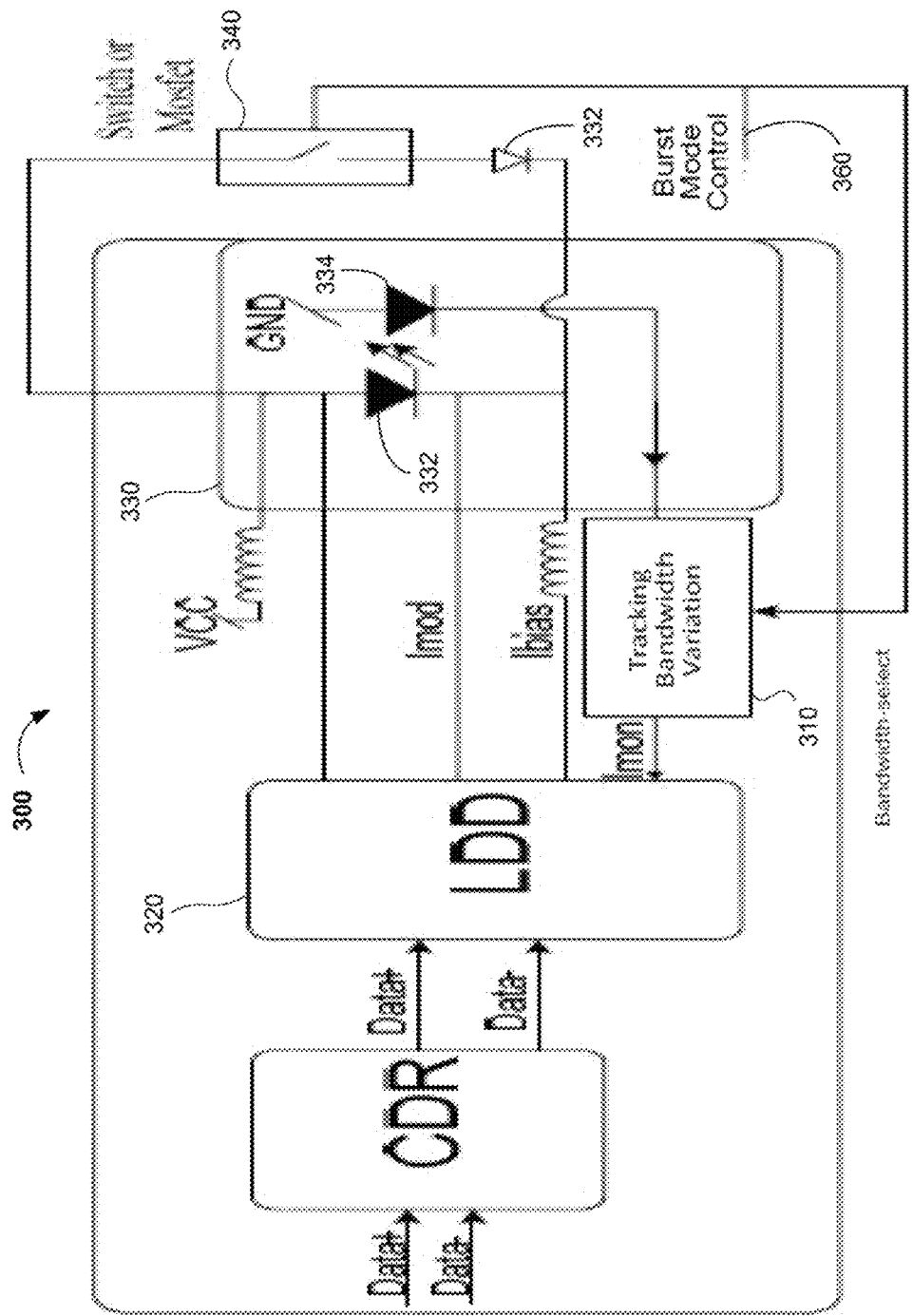
FIG. 3 is a diagram showing an exemplary DFB burst-mode control circuit according to the present invention.

FIG. 3 is a circuit diagram 300 of the present invention employing a DFB laser 330.

The burst-mode laser control circuit portion including the switch 340, the diode 342, and the bandwidth tracking and/or variation control circuit 310 is configured to provide the DFB laser 330, including laser 332 and monitor photodiode 334, with burst-mode control by an external logic signal 360 turning the switch 342 on or off, wherein the switch (e.g., a field effect transistor) 342 is in serial connection with the diode 344 and in parallel connection with the DFB laser 332. The diode 342 creates a high impedance at the cathode of the laser 332.

Burst-mode control manages the switch 340 and the bandwidth-select circuit 310 using a high or low logic level input, wherein the TTL (Transistor-Transistor Logic) high logic level may be between 2.4V and 3.3V, and the low logic level may be between 0V and 0.8V. The DFB laser 332 is disabled and the bandwidth-select circuit 310 enters the fast-track mode when the burst mode control signal 360 has a first state, such as a high logic level. The DFB laser 332 is enabled and provides regular and/or burst mode optical signals, and the bandwidth-select circuit 310 enters the slow-track mode, when the burst mode control signal 360 has a second state, such as a low logic level. In the slow-track mode, the APC loop, including the bandwidth-select circuit 310, laser diode driver (LDD) 320, and the DFB laser 330, ensures optical power stable to the DFB laser 330 using the APC loop.

Figure 4:
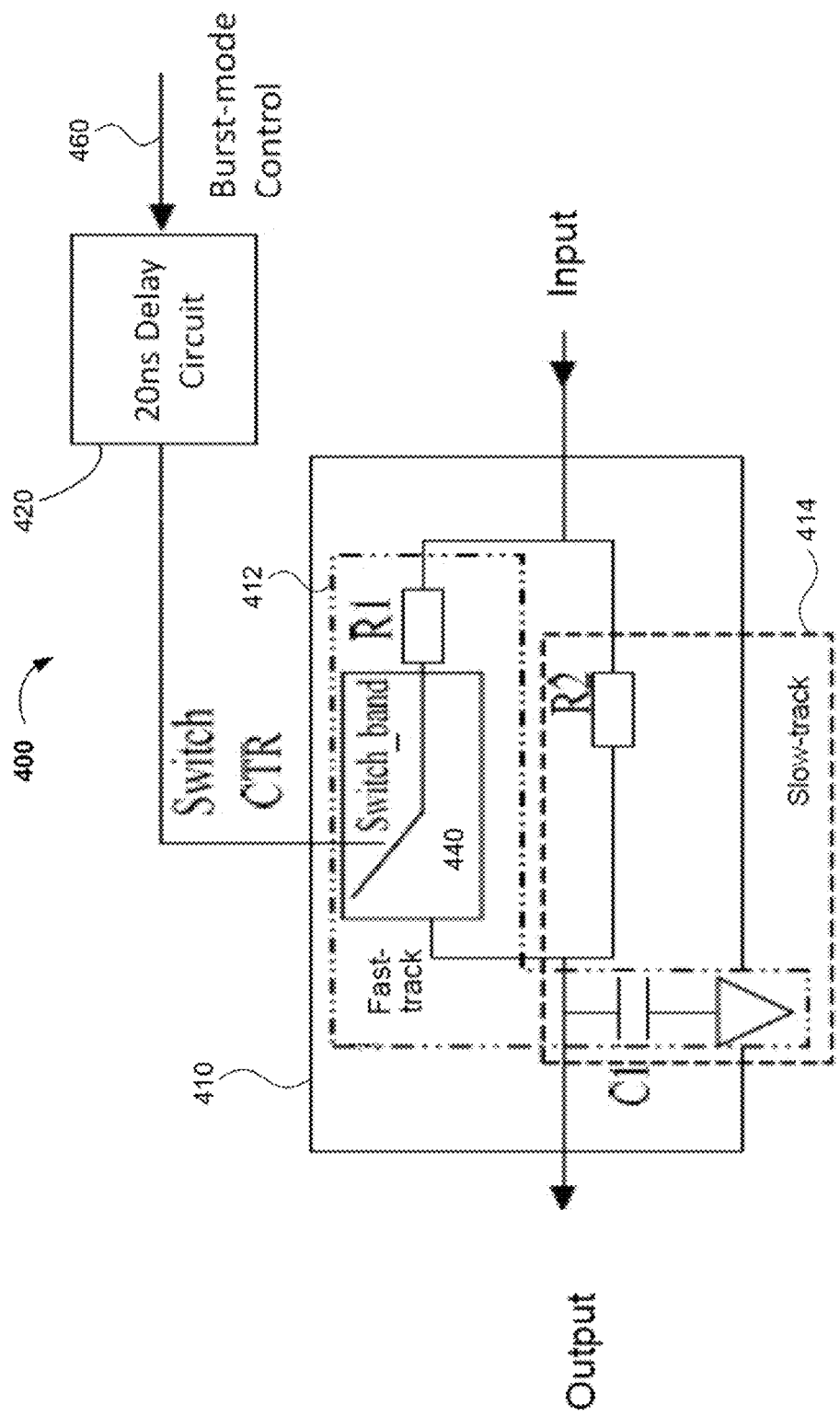
FIG. 4 is a diagram showing an exemplary bandwidth-select circuit according to the present invention.

FIG. 4 is a circuit diagram showing a bandwidth-select circuit 400 in accordance with embodiments of the present invention. The bandwidth-select circuit 400 comprises two functional blocks: a high-low bandwidth selection circuit 410, comprising a fast-track selection circuit 412 implementing the fast-track mode, and a slow-track selection circuit 414 implementing the slow-track mode; and a delay circuit 420, configured to delay the burst-mode control logic input 460 for a predetermined period of time, such as 20 ns or thereabout, to operate the APC loop in fast-track mode for the predetermined period of time (e.g., 20 ns) before the laser is enabled. That is, during the fast-track mode, automatic power control (APC) can be quickly established and a stable output power can be provided to the laser, then in the slow-track mode, the APC loop enables the laser to operate normally and transmit various code patterns in burst mode, using a continuous mode laser driver. The input is generally from a monitor photodiode, and the output is to the laser driver. The delay circuit 420 may comprise a number of inverter-type buffers, a simple resistance, a conventional one-shot pulse generator, etc.

Resistance R1, resistance R2 and capacitance C1 form alternative bandwidth selection circuits with different time constant parameters, wherein R1, switch_band 440 (when closed or turned on) and C1 form a fast-track circuit which may further include the parallel resistance R2, and have a first, relatively low time constant, and when the switch 440 is open or turned off, R2 and C1 form a slow-track circuit having a second, relatively high time constant. The greater the time constant $\tau=R*C$ for the bandwidth selection circuits, the slower the tracking of automatic power control adjustment speed is, and vice versa.

When the switch 440 is turned on, R1 and R2 are in parallel. For example, if R1 is 10 Ohms, R2 is 200 Ohms, and C1 is 0.01 μF, the RC constant for the fast-track circuit is around R1*C1=0.1; when the switch 440 is turned off, the RC constant for the slow-track circuit is about R1*C1=2. Thus, the speed of the fast-track circuit is about 20 times higher than that of the slow-track circuit, but the slow-track circuit can average input signals better to keep the optical output power stable when burst-mode signals are used to produce optical signals from the laser.

FIG. 5 is a diagram showing waveforms of signals in a logic control sequence chart 500 according to the present invention. When a control signal 510 from the PON system, the ONU light-emitting control logic signal, has a high logic level, the switch 240 in FIG. 2 and/or 340 in FIG. 3 is disconnected. The ONU transmitter (e.g., the laser) provides optical signals 520, and the laser driver drives and/or enables the laser normally. However, the bandwidth-select logic signal 530 remains at a low logic level, for example for 20 ns, before the optical signal 520 is produced. For example, the switch control signal (Switch CTR) in FIG. 4 keeps the switch Switch_band 440 closed while the bandwidth-select circuit 410 is in fast-track mode 540. As the ONU optical signal output 520 becomes stable, the bandwidth-select logic signal 510 remains at high level, and the switch control signal (Switch CTR) in FIG. 4 keeps the switch 440 open. After the delay for ONU optical signal creation and/or stabilization, the bandwidth-select circuit 410 transitions the bandwidth select signal 530 to a high logic level, and the bandwidth-select circuit 410 and the APC loop enter the slow-track mode, thereby keeping optical signals from the laser stable.

When the ONU light-emitting control logic signal 510 has a low logic level, the switch may be turned on, and the ONU transmitter disables output of the optical signal 520 from the laser. The switches 240 in FIGS. 2 and 340 in FIG. 3 are closed, the laser is connected in parallel with the diode 232 or 332, and then decreasing the voltage and/or current at ends (e.g., the cathode and/or anode) of the laser results in no optical output from the laser. The bandwidth-select circuit remains in fast-track mode until the ONU control logic signal has a high logic level again, and the delay of the delay circuit expires.

In this invention, instead of using burst-mode laser drivers, continuous-mode laser drivers can operate in burst mode and have a fast response from the laser, under the external control of one or more switch circuits. Without requiring burst-mode laser drivers, this invention can be used to provide PON systems with burst-mode ONUs, especially for high speed signals, such as 10G PON applications. This solution has the advantages of low cost, easy implementation, and easy adaptability for both DFB laser devices and EMLs. This invention ensures fast creation of stable burst-mode laser output signals using an APC loop with a continuous-mode laser driver, and normal burst-mode operations by providing bandwidth switching in the ACP loop using one or more switches and optional filter circuits.

What is claimed is:

1. A burst-mode laser control circuit, comprising:
    a) an automatic power control (APC) loop;
    b) a laser;
    c) a diode; and
    d) a burst-mode control circuit comprising a switch in series with the diode and parallel to the laser, the switch being enabled or disabled by external logic, thereby providing burst-mode control of the laser.

2. The burst-mode laser control circuit of claim 1, wherein said switch and said bandwidth-select circuit are enabled or disabled with a high or low logic level input.

3. The burst-mode laser control circuit of claim 2, wherein said bandwidth-select circuit comprises a high-low bandwidth-select circuit and a delay circuit.

4. The burst-mode laser control circuit of claim 3, wherein said high-low bandwidth-select circuit comprises has a fast-track mode and a slow-track mode.

5. The burst-mode laser control circuit of claim 4, wherein said switch disables the diode and the bandwidth-select circuit enters fast-track mode when the external logic provides a high logic level, and the laser provides optical signals and the bandwidth-select circuit enters a slow-track mode when the external logic provides a low logic level.

6. The burst-mode laser control circuit of claim 4, wherein said delay circuit comprises delay control logic configured to operate the APC loop in the fast-track mode before enabling the laser, and operate the APC loop in the slow-track when enabling the laser to operate.

7. The burst-mode laser control circuit of claim 6, wherein said delay control logic enables the APC loop to control power to the laser before the laser is enabled, thereby providing a stable laser power output when the laser begins to operate.

8. The burst-mode laser control circuit of claim 1, wherein the APC loop comprises the laser, a continuous-mode laser driver, and the bandwidth-select circuit.

9. The burst-mode laser control circuit of claim 1, wherein the laser comprises a burst mode laser.

10. The burst-mode laser control circuit of claim 9, wherein the burst mode laser comprises a distributed feedback (DFB) laser or an electro-amplitude modulated laser (EML).

11. The burst-mode laser control circuit of claim 9, further comprising a continuous mode laser driver, receiving a control signal from the APC loop and providing a driving signal to the laser.

12. A method of controlling a laser having a burst mode, comprising:
    a) when a logic input to an optical network unit (ONU) in a passive optical network (PON) has a first logic state, placing a bandwidth-select circuit in a fast-track mode for a predetermined period of time and disconnecting a switch, the ONU including the switch, a laser, a laser driver, a diode and the bandwidth-select circuit;
    b) after the predetermined period of time, driving the laser using the laser driver and transmitting an optical signal from the laser normally;
    c) when the optical signal from the laser is stable, placing the bandwidth-select circuit in a slow-track mode;
    d) when the logic input to the ONU has a second state, turning on the switch to disable the optical signal from the laser and connect the laser in parallel with the diode; and
    e) placing the bandwidth-select circuit in the fast-track mode when the logic input has the first logic state again.

13. The method of claim 12, wherein the first logic state is a low logic level, and the second logic state is a high logic level.

14. The method of claim 12, wherein the predetermined period of time is about 20 ns.

15. The method of claim 12, wherein after said logic input transitions to the second state, the bandwidth-select circuit stays in the fast-track mode for the predetermined period of time.

16. The method of claim 12, wherein placing the bandwidth-select circuit in the slow-track mode keeps optical signals from the laser stable.

17. The method of claim 12, wherein decreasing a voltage/current at a cathode and an anode of the laser results in no optical signal from the laser.

* * * * *